(12) United States Patent
Yosui

(10) Patent No.: US 11,056,756 B2
(45) Date of Patent: Jul. 6, 2021

(54) MULTILAYER SUBSTRATE CONNECTING BODY AND TRANSMISSION LINE DEVICE

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/374,768

(22) Filed: Apr. 4, 2019

(65) Prior Publication Data

US 2019/0229390 A1 Jul. 25, 2019

Related U.S. Application Data

(63) Continuation of application No. PCT/JP2017/041187, filed on Nov. 16, 2017.

(30) Foreign Application Priority Data

Dec. 1, 2016 (JP) .............................. JP2016-233973

(51) Int. Cl.
| | |
|---|---|
| *H05K 1/14* | (2006.01) |
| *H01P 3/08* | (2006.01) |
| *H05K 1/02* | (2006.01) |
| *H01L 23/13* | (2006.01) |
| *H01L 23/498* | (2006.01) |
| *H01L 23/66* | (2006.01) |

(Continued)

(52) U.S. Cl.
CPC ................ *H01P 3/08* (2013.01); *H01L 23/12* (2013.01); *H01L 23/13* (2013.01);
(Continued)

(58) Field of Classification Search
CPC .. H01P 3/08; H01L 23/13; H05K 1/02; H05K 1/14
(Continued)

(56) References Cited

U.S. PATENT DOCUMENTS 5,808,529 A * 9/1998 Hamre ..................... H01P 1/047
  333/238
7,405,948 B2 * 7/2008 Sato ..................... H01R 13/2414
  361/752

(Continued)

FOREIGN PATENT DOCUMENTS

| JP | 11-121524 A | 4/1999 |
| JP | 2001102743 A * | 4/2001 |

(Continued)

OTHER PUBLICATIONS

Official Communication issued in International Patent Application No. PCT/JP2017/041187, dated Jan. 30 2018.

*Primary Examiner* — Dean O Takaoka

(74) *Attorney, Agent, or Firm* — Keating & Bennett, LLP

(57) ABSTRACT

A multilayer substrate connecting body includes first and second multilayer substrates. The first and second multilayer substrates each include a step portion defined by a difference of a number of stacked layers of insulating base material layers, and a portion of a conductor pattern is exposed to the step portion. An anisotropic conductive film is disposed between the step portions of the first and second multilayer substrates, and portions of conductor patterns that are exposed to the step portions of the first and second multilayer substrates are electrically connected through an electrically connecting portion of the anisotropic conductive film.

20 Claims, 8 Drawing Sheets

(51) Int. Cl.
*H01L 23/12* (2006.01)
*H05K 3/46* (2006.01)

(52) U.S. Cl.
CPC ........ *H01L 23/49833* (2013.01); *H01L 23/66* (2013.01); *H05K 1/0237* (2013.01); *H05K 1/14* (2013.01); *H05K 3/46* (2013.01); *H05K 2201/0129* (2013.01); *H05K 2201/0141* (2013.01); *H05K 2201/042* (2013.01)

(58) Field of Classification Search
USPC .................................................. 333/238, 246
See application file for complete search history.

(56) References Cited

U.S. PATENT DOCUMENTS

| | | | |
|---|---|---|---|
| 8,518,304 B1 * | 8/2013 | Sammakia | H01B 1/22 174/257 |
| 2004/0238827 A1 | 12/2004 | Takayama et al. | |
| 2006/0273446 A1 | 12/2006 | Sato et al. | |
| 2015/0380848 A1 * | 12/2015 | Kato | H01R 12/78 439/67 |
| 2017/0188461 A1 * | 6/2017 | Wong | H05K 1/117 |
| 2017/0194686 A1 * | 7/2017 | Ito | H05K 1/142 |

FOREIGN PATENT DOCUMENTS

| | | | |
|---|---|---|---|
| JP | 2001-358421 A | | 12/2001 |
| JP | 2001358421 A | * | 12/2001 |
| JP | 2004-281182 A | | 10/2004 |
| WO | 2004/066691 A1 | | 8/2004 |
| WO | 2016/072338 A1 | | 5/2016 |

\* cited by examiner

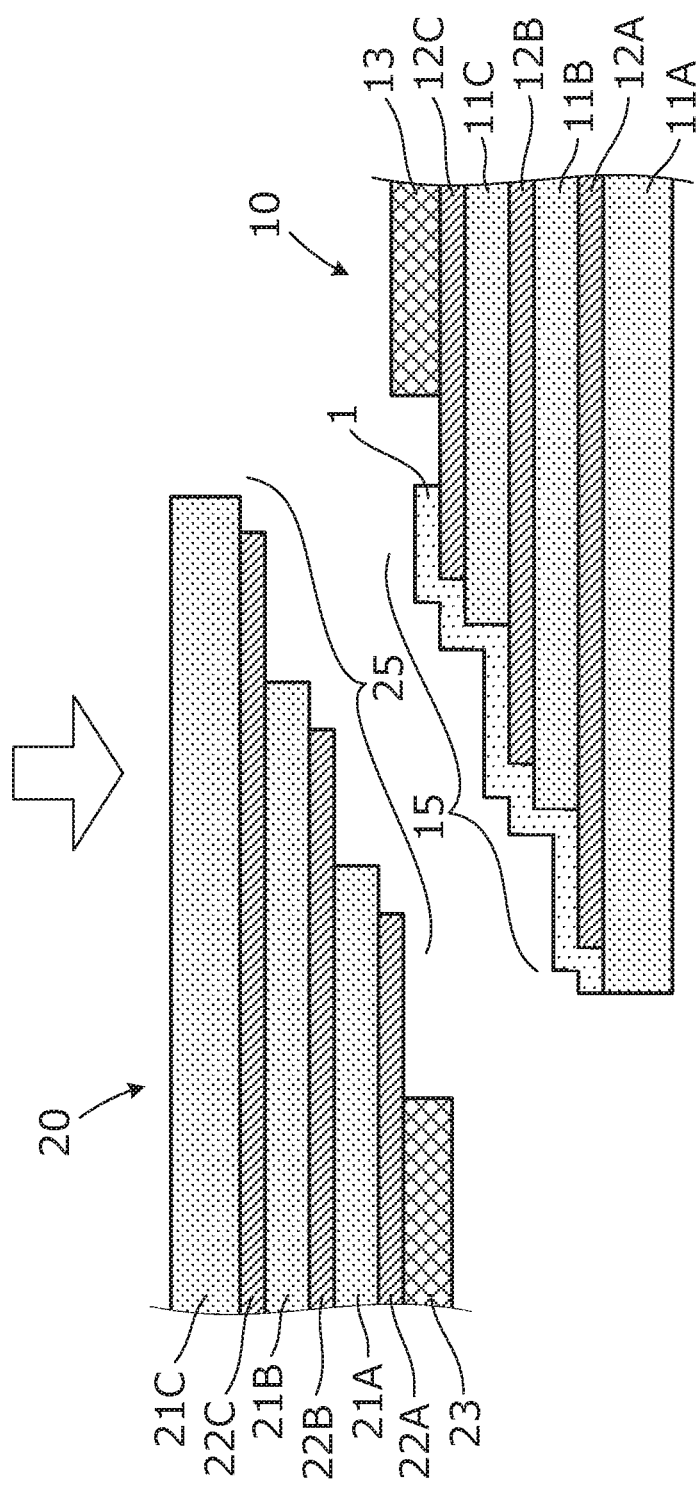

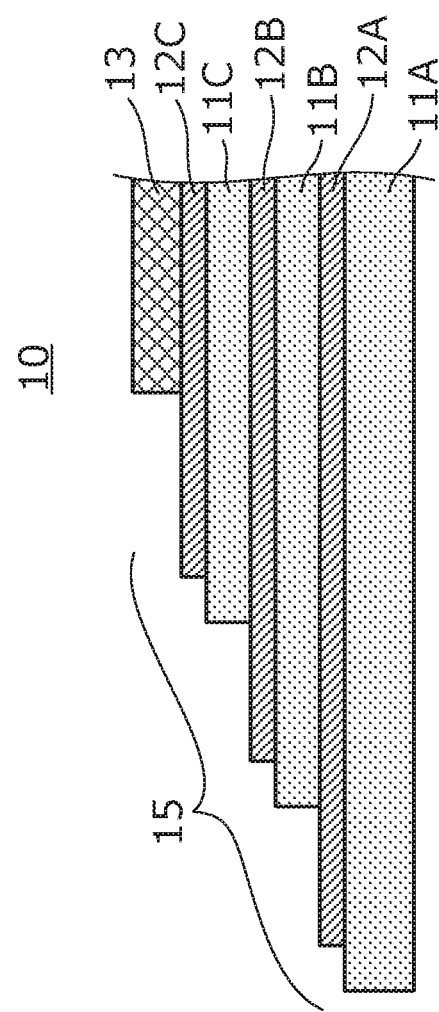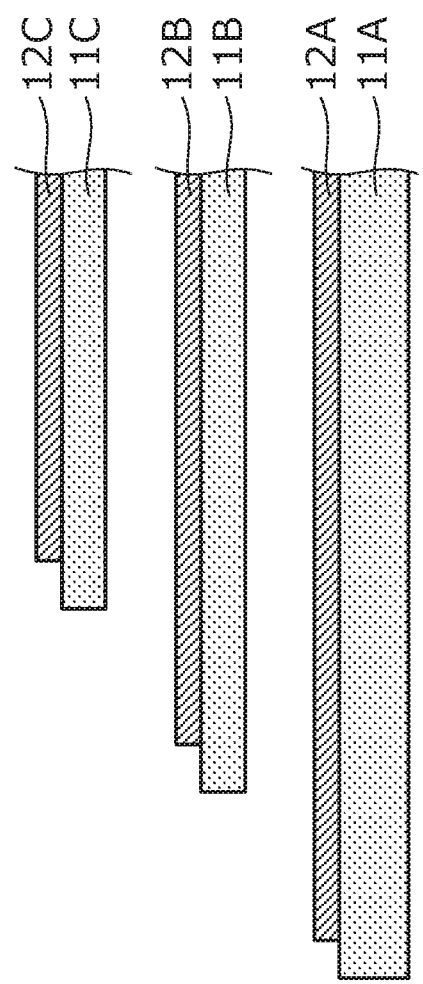

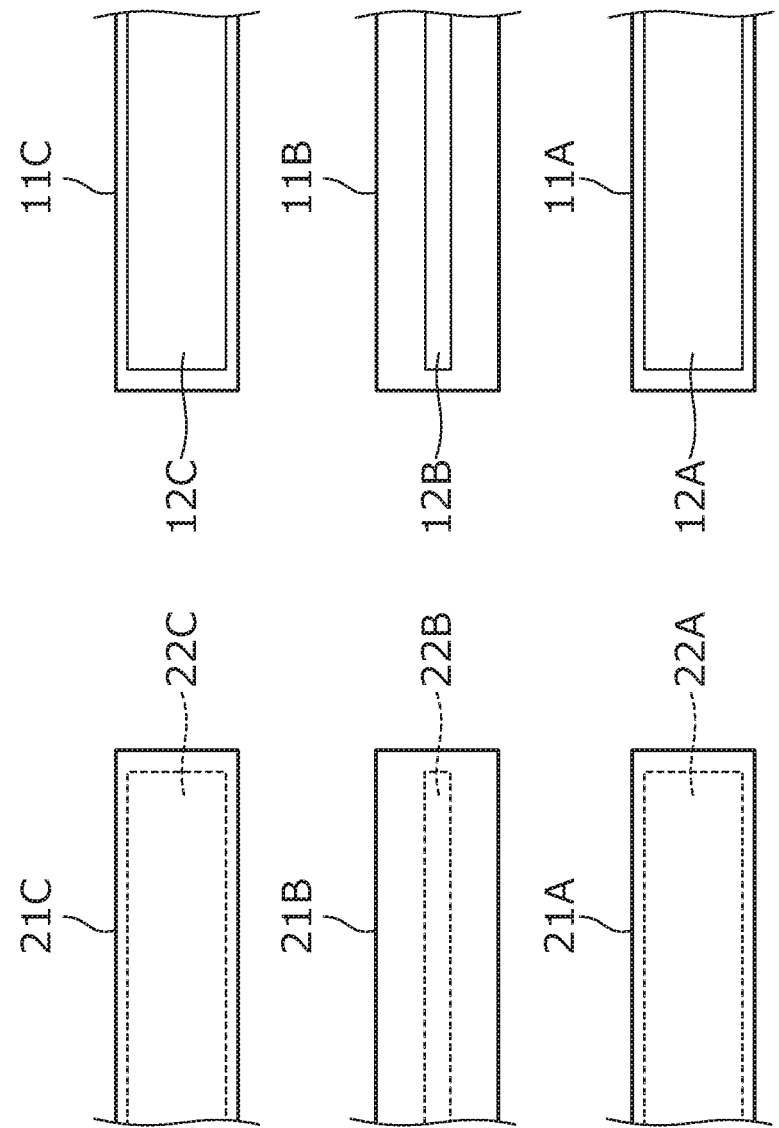

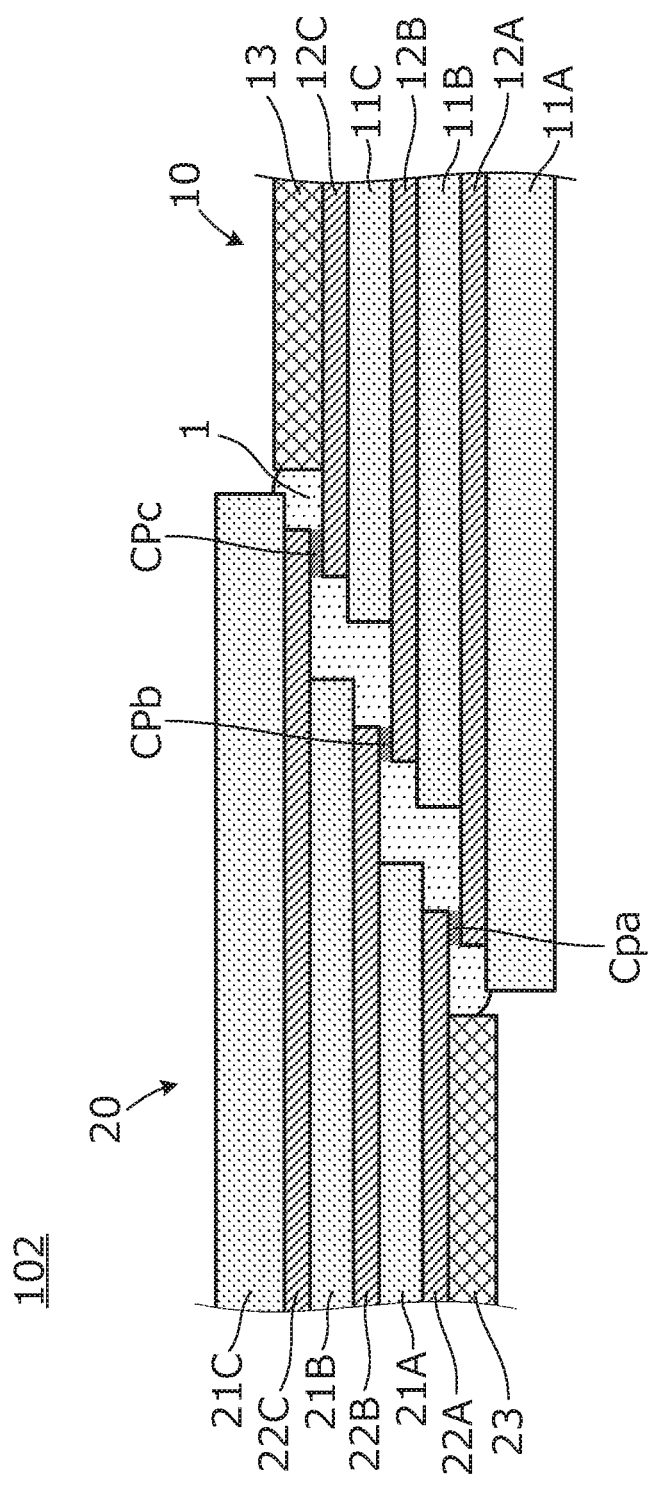

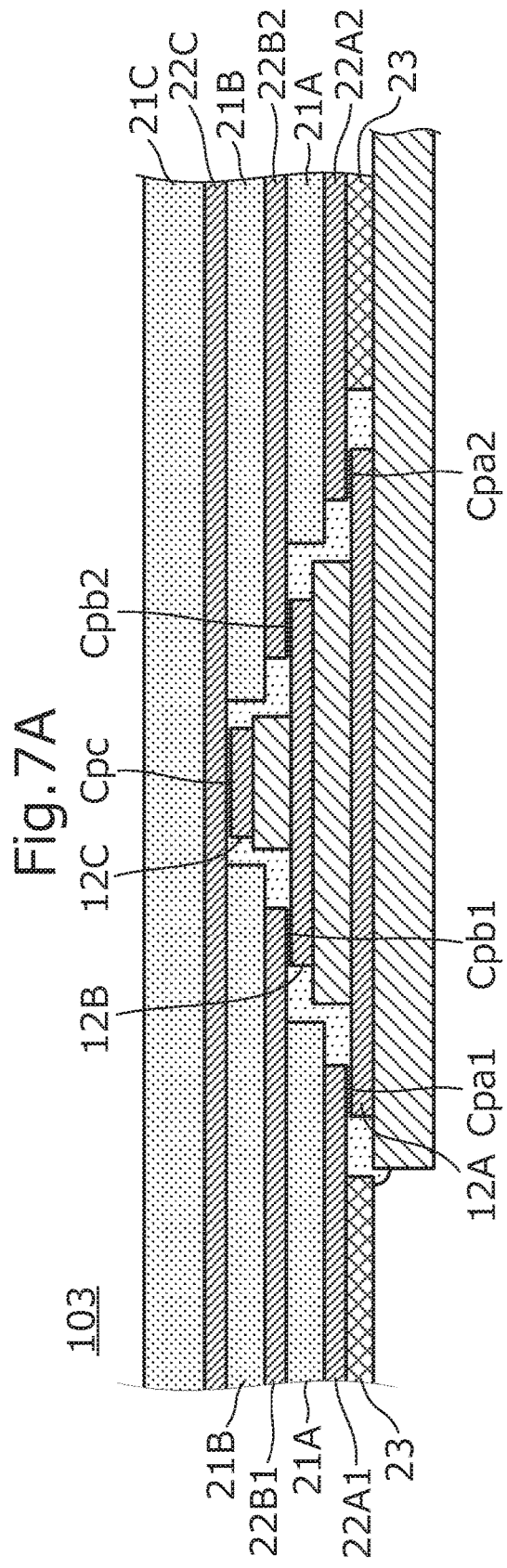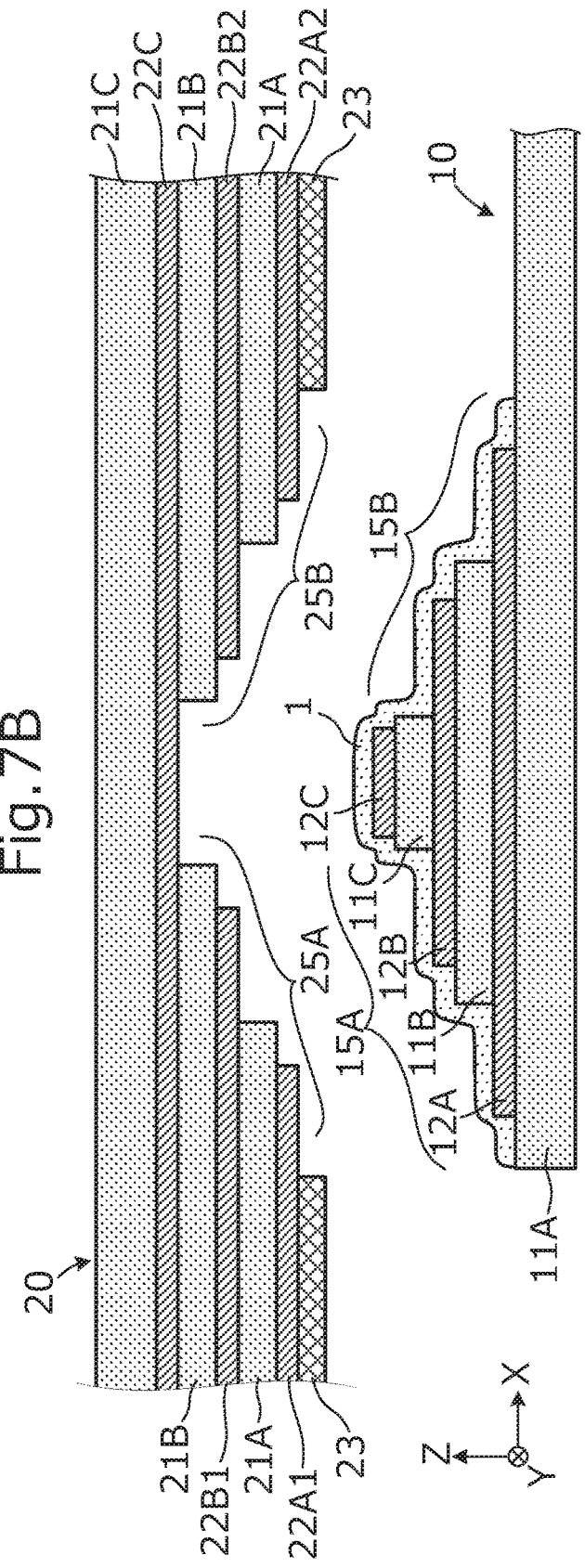

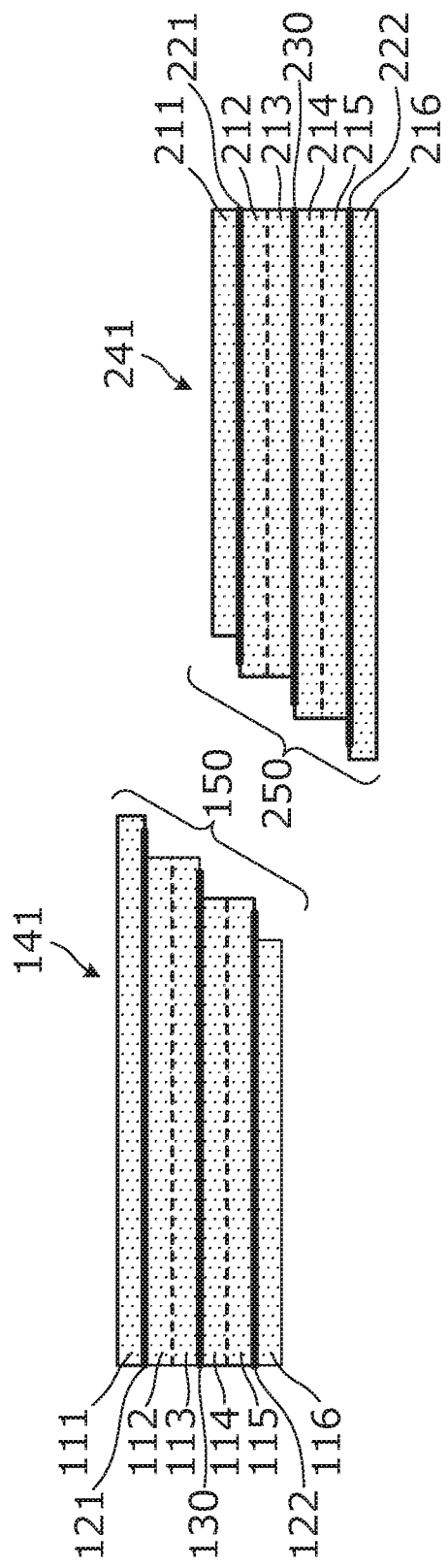

MULTILAYER SUBSTRATE CONNECTING BODY AND TRANSMISSION LINE DEVICE

CROSS REFERENCE TO RELATED APPLICATIONS

This application claims the benefit of priority to Japanese Patent Application No. 2016-233973 filed on Dec. 1, 2016 and is a Continuation Application of PCT Application No. PCT/JP2017/041187 filed on Nov. 16, 2017. The entire contents of each of these applications are hereby incorporated herein by reference.

BACKGROUND OF THE INVENTION

1. Field of the Invention

The present invention relates to a multilayer substrate connecting body in which a plurality of multilayer substrates are connected to each other, and a transmission line device that includes a multilayer substrate connecting body.

2. Description of the Related Art

International Publication No. 2016/072338 discloses a body in which a plurality of multilayer substrates that include a step portion provided due to a difference of the number of stacked layers are bonded to each other at the step portion, as one of transmission lines that transmit a high-frequency signal. FIG. 8 is a cross-sectional view of a first transmission line 141 and a second transmission line 241 included in a transmission line cable disclosed in International Publication No. 2016/072338.

The first transmission line 141 includes a first multilayer insulator that includes a plurality of insulator layers 111, 112, 113, 114, 115, and 116 that are stacked on one another, and first ground conductor patterns 121 and 122 and a first signal conductor pattern 130 that extend along the plurality of insulator layers in the first multilayer insulator. The second transmission line 241 includes a second multilayer insulator that includes a plurality of insulator layers 211, 212, 213, 214, 215, and 216 that are stacked on one another, and second ground conductor patterns 221 and 222 and a second signal conductor pattern 230 that extend along the plurality of insulator layers in the second multilayer insulator.

The first transmission line 141 includes a first connecting portion 150 to be connected to the second transmission line 241, and the second transmission line 241 includes a second connecting portion 250 to be connected to the first transmission line 141.

In the first connecting portion 150, a conductive bonding material containing low-melting-point metal powder or solder paste is applied to exposed portions of each of the first ground conductor patterns 121 and 122 and the first signal conductor pattern 130. Similarly, in the second connecting portion 250, a conductive bonding material including low-melting-point metal powder or solder paste is applied to exposed portions of each of the second ground conductor patterns 221 and 222 and the second signal conductor pattern 230.

The first transmission line 141 and the second transmission line 241 are heated so that end portions of the conductor patterns of the first transmission line 141 and end portions of the conductor patterns of the second transmission line 241 are connected to each other for electrical conduction through the conductive bonding material.

However, in a case in which the end portions of the conductor patterns that are exposed to a step portion (corresponding to the connecting portion) are connected to each other for electrical conduction, with a low-melting-point metal such as solder, the metal such as solder may flow at the time of connection, which may generate a portion to be unnecessarily electrically connected, so that the degree of difficulty in managing processes is high. Therefore, it is difficult to maintain manufacturing yield and reduce cost.

SUMMARY OF THE INVENTION

Preferred embodiments of the present invention provide multilayer substrate connecting bodies that are each capable of being easily manufactured and do not include any portion to be unnecessarily electrically connected, in a portion connected for electrical conduction, and provide transmission line devices that each include such a multilayer substrate connecting body.

A multilayer substrate connecting body according to a preferred embodiment of the present invention includes a first multilayer substrate that includes a plurality of first insulating base material layers that are stacked on one another, and a first conductor pattern provided on each of at least two of the plurality of first insulating base material layers; a second multilayer substrate that includes a plurality of second insulating base material layers that are stacked on one another, and a second conductor pattern provided on each of at least two of the plurality of second insulating base material layers, and an anisotropic conductive film, and each of the first multilayer substrate and the second multilayer substrate includes a step portion that is provided due to a difference of a number of stacked layers of the plurality of first and second insulating base material layers and exposes a portion of a plurality of the first and second conductor patterns, the plurality of first conductor patterns that are exposed to the step portion of the first multilayer substrate are disposed at respective different positions in a stacking direction in which the plurality of first insulating base material layers are stacked, the plurality of second conductor patterns that are exposed to the step portion of the second multilayer substrate are disposed at respective different positions in the stacking direction, and the anisotropic conductive film is disposed between the step portion of the first multilayer substrate and the step portion of the second multilayer substrate and causes portions of the plurality of first and second conductor patterns that are respectively exposed to the step portion of the first multilayer substrate and the step portion of the second multilayer substrate to be electrically connected to each other at a plurality of positions of the anisotropic conductive film.

According to the above configuration, the portions of the plurality of first and second conductor patterns that are exposed to the step portions are electrically connected to each other through a portion of the anisotropic conductive film, the portion being under pressure, a conventional flow of a conductive bonding material does not occur and no portion to be unnecessarily electrically connected is provided in a portion connected for electrical conduction.

The plurality of first conductor patterns that are exposed to the step portion of the first multilayer substrate, in the stacking direction, may preferably partially project from a surface of the step portion of the first multilayer substrate; the plurality of second conductor patterns that are exposed to the step portion of the second multilayer substrate, in the stacking direction, may preferably partially project from a surface of the step portion of the second multilayer substrate; and the plurality of first conductor patterns that are exposed to the step portion of the first multilayer substrate may preferably be electrically connected to the plurality of second conductor patterns that are exposed to the step portion of the second multilayer substrate only in an area in which the plurality of first conductor patterns that are exposed to the step portion of the first multilayer substrate respectively face the plurality of second conductor patterns that are exposed to the step portion of the second multilayer substrate.

The plurality of first conductor patterns that are exposed to the step portion of the first multilayer substrate may preferably not extend to an end portion of the step portion of the first multilayer substrate, and the plurality of second conductor patterns that are exposed to the step portion of the second multilayer substrate may preferably not extend to an end portion of the step portion of the second multilayer substrate.

The thickness of the anisotropic conductive film may preferably be smaller than the total thickness of an insulating base material layer and a conductor pattern that are in contact with the anisotropic conductive film. As a result, an anisotropic conductive film easily deforms and, in particular, easily deforms along the steps of the step portion. Therefore, bonding failure mainly due to intervening air bubbles is reduced or prevented.

The projecting length by which a conductor pattern that is exposed to the step portion projects in a planar direction of the plurality of first and second insulating base material layers may preferably be larger than the total thickness length of an insulating base material layer and a conductor pattern that are in contact with the anisotropic conductive film. As a result, the anisotropic conductive film is difficult to be twisted and is uniformly pressurized, and thus bonding failure is reduced or prevented.

A transmission line device according to a preferred embodiment of the present invention includes a multilayer substrate connecting body according to a preferred embodiment of the present invention, and the plurality of first conductor patterns included in the first multilayer substrate include a first signal conductor pattern and a first ground conductor pattern that define a first transmission line, the plurality of second conductor patterns included in the second multilayer substrate include a second signal conductor pattern and a second ground conductor pattern that define a second transmission line, the first signal conductor pattern and the second signal conductor pattern are electrically connected to each other at the step portion, and the first ground conductor pattern and the second ground conductor pattern are electrically connected to each other at the step portion.

According to the above configuration, a plurality of multilayer substrates are connected to define a transmission line to which a signal is transmitted, so that a transmission line device having a complex planar shape is easily obtained.

According to various preferred embodiments of the present invention, it is possible to obtain multilayer substrate connecting bodies that are each capable of being easily manufactured and do not include any portion to be unnecessarily electrically connected, in a portion connected for electrical conduction, and transmission line devices that each include a multilayer substrate connecting body.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a cross-sectional view of the main portion in a state before connection of the multilayer substrate connecting body 101.

FIG. 3A is a cross-sectional view of the main portion of a first multilayer substrate 10 that is a portion of the multilayer substrate connecting body 101. FIG. 3B is an exploded cross-sectional view of the first multilayer substrate 10.

FIG. 5 is a diagram illustrating a planar shape of a conductor pattern provided on each of insulating base material layers that define a transmission line device 201.

FIG. 6 is a cross-sectional view of a main portion of a multilayer substrate connecting body 102 according to a third preferred embodiment of the present invention.

FIG. 7A is a cross-sectional view of a main portion of a multilayer substrate connecting body 103 according to a fourth preferred embodiment of the present invention, and FIG. 7B is a cross-sectional view in a state before connection between a first multilayer substrate 10 and a second multilayer substrate 20.

FIG. 8 is a cross-sectional view of a first transmission line 141 and a second transmission line 241 included in a transmission line cable disclosed in International Publication No. 2016/072338.

DETAILED DESCRIPTION OF THE PREFERRED EMBODIMENTS

Figure 1:
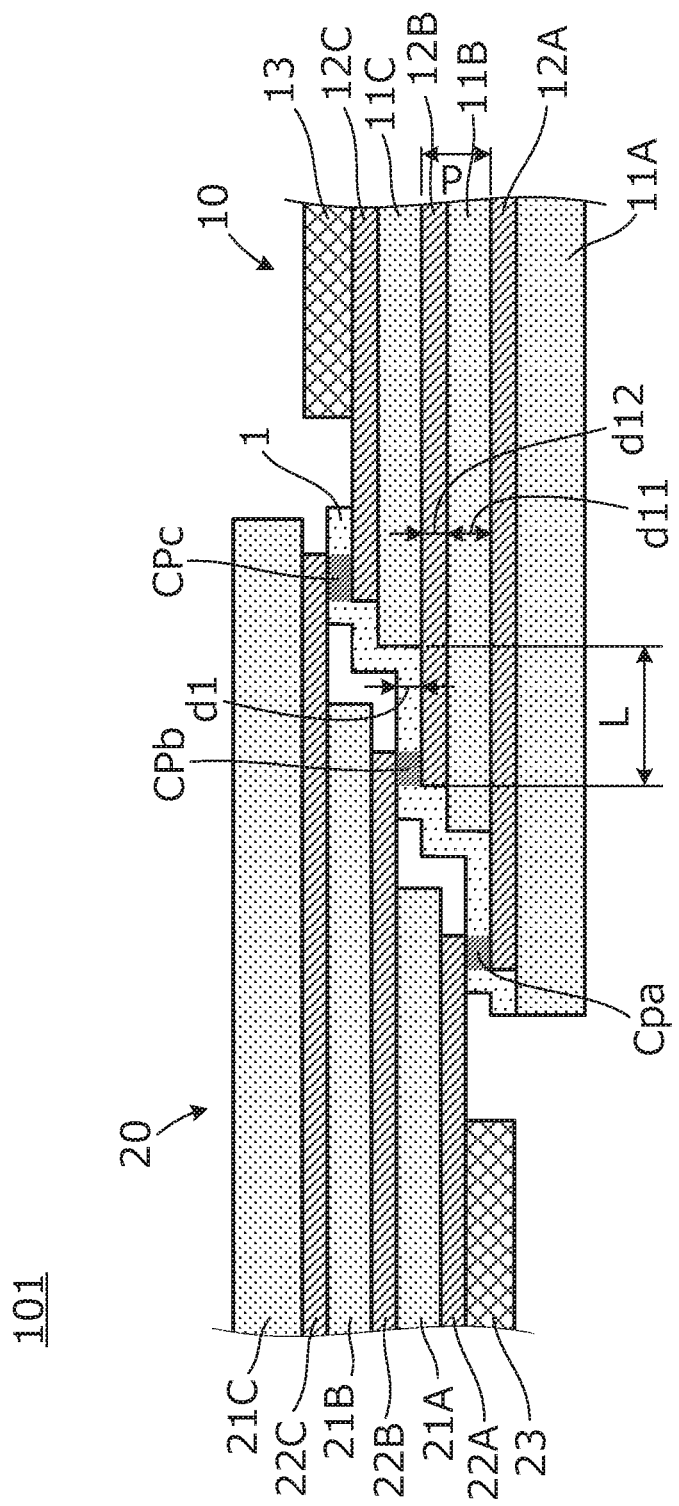
FIG. 1 is a cross-sectional view of a main portion of a multilayer substrate connecting body 101 according to a first preferred embodiment of the present invention.

Hereinafter, a plurality of preferred embodiments of the present invention will be described with reference to the attached drawings and several specific examples. In the drawings, the same or similar components and elements are denoted by the same reference signs. While preferred embodiments are divided and described for the sake of convenience in consideration of facilitating description or understanding of main points, elements described in different preferred embodiments are able to be partially replaced and combined with each other. In the second and subsequent preferred embodiments, a description of features common to the first preferred embodiment will be omitted, and different features are primarily described. In particular, a description of similar advantageous operational effects achieved by the same or similar structures will not be repeated in each preferred embodiment.

First Preferred Embodiment

FIG. 1 is a cross-sectional view of a main portion of a multilayer substrate connecting body 101 according to a first preferred embodiment of the present invention. FIG. 2 is a cross-sectional view of the main portion in a state before connection of the multilayer substrate connecting body 101. FIG. 3A is a cross-sectional view of the main portion of a first multilayer substrate 10 that is a portion of the multilayer substrate connecting body 101. FIG. 3B is an exploded cross-sectional view of the first multilayer substrate 10.

The multilayer substrate connecting body 101 includes a first multilayer substrate 10 and a second multilayer substrate 20. As shown in FIG. 2, the first multilayer substrate 10 includes a stair-shaped step portion 15, due to a difference of the number of stacked layers of insulating base material layers. Similarly, the second multilayer substrate 20 includes a stair-shaped step portion 25, due to a difference of the number of stacked layers of insulating base material layers.

The first multilayer substrate 10 includes a plurality of insulating base material layers 11A, 11B, and 11C that are stacked on one another, and conductor patterns 12A, 12B, and 12C respectively provided on the plurality of insulating base material layers 11A, 11B, and 11C. Similarly, the second multilayer substrate 20 includes a plurality of insulating base material layers 21A, 21B, and 21C that are stacked on one another, and conductor patterns 22A, 22B, and 22C respectively provided on the plurality of insulating base material layers 21A, 21B, and 21C. In the present preferred embodiment, a resist film 13 is provided on the surface of the insulating base material layer 11C and the conductor pattern 12C, and a resist film 23 is provided on the surface of the insulating base material layer 21A and the conductor pattern 22A.

As shown in FIG. 3A, an end portion of each of the conductor patterns 12A, 12B, and 12C is exposed to the step portion 15 of the first multilayer substrate 10. In addition, as shown in FIG. 2, an end portion of each of the conductor patterns 22A, 22B, and 22C is exposed to the step portion 25 of the second multilayer substrate 20.

As shown in FIG. 1, the multilayer substrate connecting body 101 includes an anisotropic conductive film 1 disposed between the step portion 15 of the first multilayer substrate 10 and the step portion 25 of the second multilayer substrate 20, and, through the anisotropic conductive film 1, a portion of the conductor patterns 12A, 12B, and 12C exposed to the step portion 15 and a portion of the conductor patterns 22A, 22B, and 22C exposed to the step portion 25 are respectively electrically connected to each other.

The anisotropic conductive film 1 is preferably formed by, for example, molding a material obtained by dispersing fine conductive particles in a thermosetting resin into a film shape. This anisotropic conductive film 1 has conductivity in a thickness direction at a portion to which pressure greater than or equal to a predetermined pressure is applied during thermocompression bonding and of which the film thickness is reduced. In FIG. 1, the conductor pattern 12A and the conductor pattern 22A are electrically connected through an electrically connecting portion CPa of the anisotropic conductive film 1 that is interposed between the conductor pattern 12A and the conductor pattern 22A and is partially pressurized. Similarly, the conductor pattern 12B and the conductor pattern 22B are electrically connected through an electrically connecting portion CPb of the anisotropic conductive film 1 that is interposed between the conductor pattern 12B and the conductor pattern 22B and is partially pressurized. Further, the conductor pattern 12C and the conductor pattern 22C are electrically connected through an electrically connecting portion CPc of the anisotropic conductive film 1 that is interposed between the conductor pattern 12C and the conductor pattern 22C and is partially pressurized. As described above, although being a single film, the anisotropic conductive film 1 causes the conductor patterns that face each other in a stacking direction to be electrically connected at a plurality of portions of the anisotropic conductive film 1.

The above-described anisotropic conductive film 1 may be provided by attaching or placing a film-shaped material or may be provided by applying and drying a paste material.

The first multilayer substrate 10, as shown in FIG. 3B, includes an insulating base material layer 11A that includes the conductor pattern 12A, an insulating base material layer 11B that includes the conductor pattern 12B, and an insulating base material layer 11C that includes the conductor pattern 12C. The insulating base material layers 11A, 11B, and 11C are preferably thermoplastic resin, such as a liquid crystal polymer (LCP), for example, and the conductor patterns 12A, 12B, and 12C are obtained by attaching copper foil and patterning by photolithography. These insulating base material layers 11A, 11B, and 11C are stacked and thermally pressed preferably at about 300° C., for example. Subsequently, the resist film 13 is provided by printing or attaching when necessary. The same applies to the second multilayer substrate 20.

The anisotropic conductive film 1 is preferably a sheet of thermosetting adhesive in a semi-hardened (half-dry) state before bonding. As shown in FIG. 2, the anisotropic conductive film 1 is attached to the step portion 15 of the first multilayer substrate 10, or the step portion 25 of the second multilayer substrate 20 before bonding. In the state shown in FIG. 2, the step portion 15 of the first multilayer substrate 10 and the step portion 25 of the second multilayer substrate 20 are overlapped with each other and pressurized and heated in the stacking direction of the first multilayer substrate 10 and the second multilayer substrate 20. As a result, the step portion 15 of the first multilayer substrate 10 and the step portion 25 of the second multilayer substrate 20 are subjected to thermocompression bonding. The temperature during the thermocompression bonding preferably ranges from about 150° C. to about 200° C., for example, and is lower than the temperature during thermal pressing of the first multilayer substrate 10 and the second multilayer substrate 20 (about 300° C., for example), so that the first multilayer substrate 10 and the second multilayer substrate 20 do not deform greatly by being compressed during the thermocompression bonding.

In the multilayer substrate connecting body 101, the thickness of the anisotropic conductive film 1 may preferably be smaller than the sum of the thickness of the insulating base material layers 11A, 11B, 11C, 21A, 21B, and 21C that are in contact with the anisotropic conductive film 1 and the thickness of the conductor patterns 12A, 12B, 12C, 22A, 22B, and 22C that are in contact with the anisotropic conductive film 1. For example, the thickness of each of the insulating base material layers 11A, 11B, 11C, 21A, 21B, and 21C is preferably about 25 μm, the thickness of each of the conductor patterns 12A, 12B, 12C, 22A, 22B, and 22C is preferably about 25 μm, and the thickness of the anisotropic conductive film 1 after the thermocompression bonding is preferably 10 μm. As shown in FIG. 1, when the thickness of the insulating base material layer 11B is indicated by d11, the thickness of the conductor pattern 12B is indicated by d12, and the thickness of the anisotropic conductive film 1 is indicated by d1, d1<(d11+d12) is satisfied. Accordingly, the anisotropic conductive film 1 easily deforms and in particular easily deforms along the steps of the step portions 15 and 25. Therefore, bonding failure mainly due to intervening air bubbles is reduced or prevented.

In addition, in the multilayer substrate connecting body 101, the projecting length by which the conductor patterns 12A, 12B, 12C, 22A, 22B and 22C that are exposed to the step portions 15 and 25 project in a planar direction of the insulating base material layers may preferably be larger than the sum of the thickness of the insulating base material layers 11A, 11B, 11C, 21A, 21B, and 21C that are in contact with the anisotropic conductive film 1 and the thickness of the conductor patterns 12A, 12B, 12C, 22A, 22B, and 22C that are in contact with the anisotropic conductive film 1. For example, the length L of the exposed portion of the conductor pattern 12B is preferably about 500 μm, and L>(d11+d12) is satisfied. Accordingly, the anisotropic conductive film is difficult to be twisted and is uniformly pressurized, and thus bonding failure is reduced or prevented.

It is to be noted that, since the thickness of each of the insulating base material layers, the thickness of each of the conductor patterns, and the length of each of the conductor patterns respectively have variations, any of the "sums" is a statistical representative value, such as an average (arithmetic average, geometric mean, harmonic mean) value, a mode value, and a median value.

Second Preferred Embodiment

Figure 4:
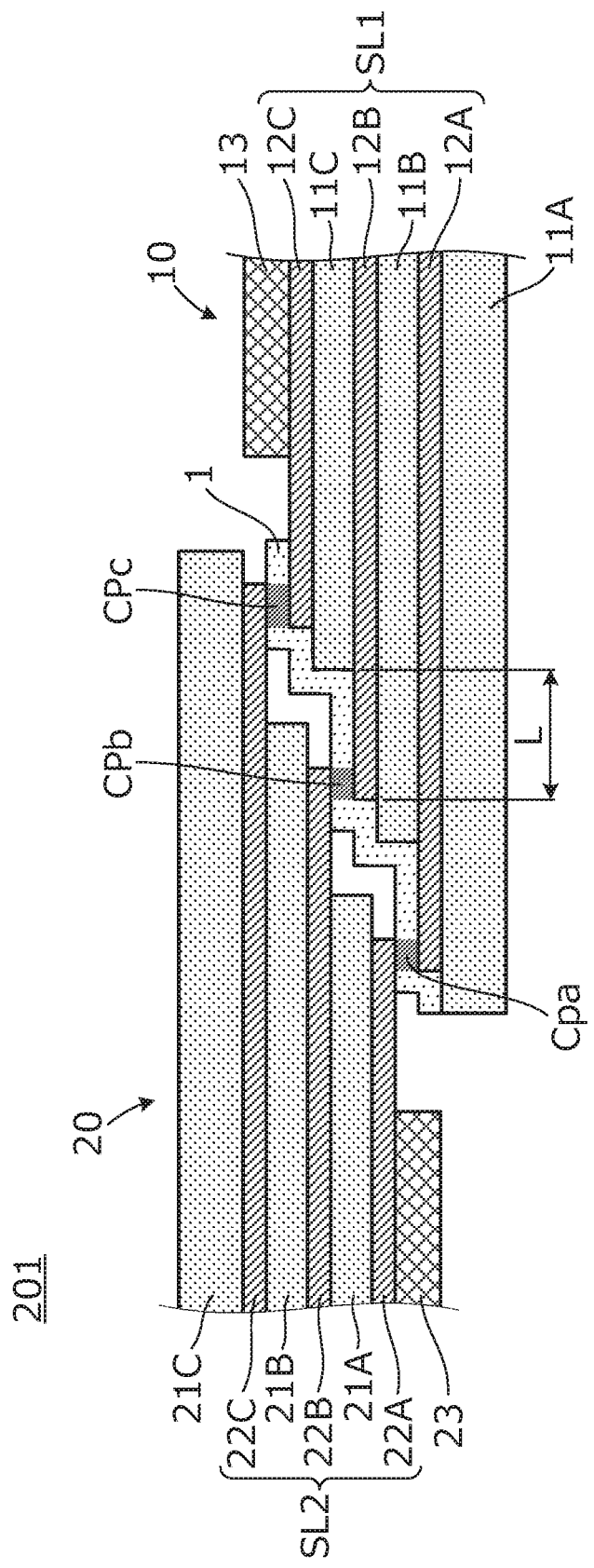
FIG. 4 is a cross-sectional view of a main portion of a transmission line device 201 according to a second preferred embodiment of the present invention.

FIG. 4 is a cross-sectional view of a main portion of a transmission line device 201 according to a second preferred embodiment of the present invention. FIG. 5 is a diagram illustrating a planar shape of a conductor pattern provided on each of insulating base material layers that define a transmission line device 201.

The transmission line device 201 includes a first multilayer substrate 10 and a second multilayer substrate 20. As shown in FIG. 4, the first multilayer substrate 10 includes a stair-shaped step portion in a portion of the first multilayer substrate 10, due to a difference of the number of stacked layers of insulating base material layers. Similarly, the second multilayer substrate 20 includes a stair-shaped step portion in a portion of the second multilayer substrate 20, due to a difference of the number of stacked layers of insulating base material layers. The cross-sectional shape of this transmission line device 201 is the same or substantially the same as the cross-sectional shape of the multilayer substrate connecting body 101 shown in the first preferred embodiment.

As shown in FIG. 5, the conductor pattern 12A provided on the insulating base material layer 11A and the conductor pattern 12C provided on the insulating base material layer 11C define first ground conductor patterns, and the conductor pattern 12B provided on the insulating base material layer 11B defines a first signal conductor pattern. These conductor patterns 12A and 12C (the first ground conductor patterns), the conductor pattern 12B (the first signal conductor pattern), and the insulating base material layer 11B define a first transmission line SL1 having a stripline structure. Similarly, the conductor pattern 22A provided on the insulating base material layer 21A and the conductor pattern 22C provided on the insulating base material layer 21C define second ground conductor patterns, and the conductor pattern 22B provided on the insulating base material layer 21B defines a second signal conductor pattern. These conductor patterns 22A and 22C (the second ground conductor patterns), the conductor pattern 22B (the second signal conductor pattern), and the insulating base material layer 21B define a second transmission line SL2 having a stripline structure. The characteristic impedances of the first transmission line and the second transmission line are the same or substantially the same, for example, about 50Ω.

As shown in FIG. 4, the first multilayer substrate 10 and the second multilayer substrate 20 are connected to each other, so that the conductor patterns 12A and 12C (the first ground conductor patterns) and the conductor patterns 22A and 22C (the second ground conductor patterns) are respectively connected to each other, and the conductor pattern 12B (the first signal conductor pattern) and the conductor pattern 22B (second signal conductor pattern) are connected to each other. As a result, the first transmission line and the second transmission line are connected while impedance matching is performed.

Third Preferred Embodiment

FIG. 6 is a cross-sectional view of a main portion of a multilayer substrate connecting body 102 according to a third preferred embodiment of the present invention.

The multilayer substrate connecting body 102 includes a first multilayer substrate 10 and a second multilayer substrate 20. As shown in FIG. 6, the first multilayer substrate 10 includes a stair-shaped step portion due to a difference of the number of stacked layers of insulating base material layers. Similarly, the second multilayer substrate 20 includes a stair-shaped step portion due to difference of the number of stacked layers of insulating base material layers.

The anisotropic conductive film 1 of the multilayer substrate connecting body 102 is filled between the step portion of the first multilayer substrate 10 and the step portion of the second multilayer substrate 20. Remaining configurations are the same or substantially the same as the configurations of the multilayer substrate connecting body 101 shown in the first preferred embodiment.

As shown in FIG. 2, the anisotropic conductive film 1 is disposed (attached) between the step portion of the first multilayer substrate 10 and the step portion of the second multilayer substrate 20, and the step portions are stacked and pressure bonded, so that the anisotropic conductive film 1 becomes thinner, and a space generated between the step portion of the first multilayer substrate 10 and the step portion of the second multilayer substrate 20 is filled with the anisotropic conductive film 1. In other words, a portion that is thicker than the thickness of the anisotropic conductive film 1 before thermocompression bonding is also filled with the anisotropic conductive film 1 after the thermocompression bonding. As a result, the step portion of the first multilayer substrate 10 and the step portion of the second multilayer substrate 20 are bonded over the entire or substantially the entire opposed surfaces through the anisotropic conductive film 1. Therefore, the bonding strength of the first multilayer substrate 10 and the second multilayer substrate 20 is high. In addition, bonding failure due to air bubbles intervening between the step portion of the first multilayer substrate 10 and the step portion of the second multilayer substrate 20 is reduced or prevented.

It is to be noted that the anisotropic conductive film 1 may preferably extend to the resist film 13. Accordingly, the end portion of each of the first multilayer substrate 10 and the second multilayer substrate 20 is reinforced, so that separation from the end portion is significantly reduced or prevented.

Fourth Preferred Embodiment

FIG. 7A is a cross-sectional view of a main portion of a multilayer substrate connecting body 103 according to a fourth preferred embodiment of the present invention, and FIG. 7B is a cross-sectional view in a state before connection between a first multilayer substrate 10 and a second multilayer substrate 20.

The multilayer substrate connecting body 103 includes a first multilayer substrate 10 and a second multilayer substrate 20. Similarly, the first multilayer substrate 10 includes stair-shaped step portions 15A and 15B due to a difference of the number of stacked layers of insulating base material layers. Similarly, the second multilayer substrate 20 includes stair-shaped step portions 25A and 25B due to a difference of the number of stacked layers of insulating base material layers.

The first multilayer substrate 10 includes a plurality of insulating base material layers 11A, 11B, and 11C that are stacked on one another, and conductor patterns 12A, 12B, and 12C respectively provided on the plurality of insulating base material layers 11A, 11B, and 11C. Similarly, the second multilayer substrate 20 includes a plurality of insulating base material layers 21A, 21B, and 21C that are stacked on one another, and conductor patterns 22A1, 22A2, 22B1, 22B2, and 22C respectively provided on the plurality of insulating base material layers 21A, 21B, and 21C. A resist film 23 is provided on the surface of the insulating base material layer 21A and the conductor patterns 22A1 and 22A2.

The multilayer substrate connecting body 103 includes an anisotropic conductive film 1 disposed between the step portions 15A and 15B of the first multilayer substrate 10 and the step portions 25A and 25B of the second multilayer substrate 20, and, through the anisotropic conductive film 1, one end of the conductor pattern 12A exposed to the step portion 15A and the conductor pattern 22A1 exposed to the step portion 25A are electrically connected to each other through an electrically connecting portion CPa1, and the other end of the conductor pattern 12A exposed to the step portion 15B and the conductor pattern 22A2 exposed to the step portion 25B are electrically connected to each other through an electrically connecting portion CPa2. Similarly, through the anisotropic conductive film 1, one end of the conductor pattern 12B exposed to the step portion 15A and the conductor pattern 22B1 exposed to the step portion 25A are electrically connected to each other through an electrically connecting portion CPb1, and the other end of the conductor pattern 12B exposed to the step portion 15B and the conductor pattern 22B2 exposed to the step portion 25B are electrically connected to each other through an electrically connecting portion CPb2. In addition, through the anisotropic conductive film 1, the conductor pattern 12C and the conductor pattern 22C are electrically connected to each other through an electrically connecting portion CPc.

As with the conductor patterns 12A and 12B that are described in the fourth preferred embodiment, preferred embodiments of the present invention are also applicable to a case in which a plurality of portions of a conductor pattern on one side are connected to a conductor pattern on the other side. In addition, as with the conductor pattern 12C, preferred embodiments of the present invention are also applicable to a case in which the entirety or substantially the entirety of a conductor pattern on one side is connected to a conductor pattern (the conductor pattern 22C) on the other side.

According to the fourth preferred embodiment, since the step portions 15A and 15B of the first multilayer substrate 10 are fit into the step portions 25A and 25B of the second multilayer substrate 20, the positioning in the X-axis direction of the first multilayer substrate 10 and the second multilayer substrate 20 is facilitated. In addition, the relative positional deviation in the X-axis direction of the first multilayer substrate 10 and the second multilayer substrate 20 is able to be significantly reduced or prevented.

It is to be noted that, while the fourth preferred embodiment describes an example in which the X-Z cross-section shown in FIG. 7A and FIG. 7B illustrates that the step portion of the first multilayer substrate 10 has a mountain shape and the step portion of the second multilayer substrate 20 has a valley shape, preferred embodiments of the present invention are also applicable to a structure (a structure in which the step portion of the first multilayer substrate 10 has a pyramid shape, for example) in which the mountain shape and the valley shape are illustrated in another cross-section, that is, the Y-Z cross-section, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate connecting body comprising:
   a first multilayer substrate that includes:
      a plurality of first insulating base material layers that are stacked on one another; and
      a first conductor pattern provided on each of at least two of the plurality of first insulating base material layers;
   a second multilayer substrate that includes:
      a plurality of second insulating base material layers that are stacked on one another; and
      a second conductor pattern provided on each of at least two of the plurality of second insulating base material layers; and
   an anisotropic conductive film; wherein
   each of the first multilayer substrate and the second multilayer substrate includes a step portion that is provided due to a difference of a number of stacked layers of the plurality of first and second insulating base material layers and exposes a portion of a plurality of the first and the second conductor patterns;
   the plurality of first conductor patterns that are exposed to the step portion of the first multilayer substrate are disposed at respective different positions in a stacking direction in which the plurality of first insulating base material layers are stacked;
   the plurality of second conductor patterns that are exposed to the step portion of the second multilayer substrate disposed at respective different positions in the stacking direction;
   the anisotropic conductive film is disposed between the step portion of the first multilayer substrate and the step portion of the second multilayer substrate, and causes portions of the plurality of first and second conductor patterns that are respectively exposed to the step portion of the first multilayer substrate and the step portion of the second multilayer substrate to be electrically connected to each other at a plurality of positions of the anisotropic conductive film;
   the step portion of at least one of the first and second multilayer substrates includes a plurality of steps;
   the anisotropic conductive film includes a single anisotropic conductive film that covers the plurality of steps of the step portion of the at least one of the first and second multilayer substrates;
   a distance in the stacking direction between the step portion of the first multilayer substrate and the step portion of the second multilayer substrate is constant or substantially constant; and
   a resist film is provided on a portion of at least one of the first conductor pattern and the second conductor pattern.

2. The multilayer substrate connecting body according to claim 1, wherein
   the plurality of first conductor patterns that are exposed to the step portion of the first multilayer substrate, in the stacking direction, partially project from a surface of the step portion of the first multilayer substrate;

the plurality of second conductor patterns that are exposed to the step portion of the second multilayer substrate, in the stacking direction, partially project from a surface of the step portion of the second multilayer substrate; and the plurality of first conductor patterns that are exposed to the step portion of the first multilayer substrate are electrically connected to the plurality of second conductor patterns that are exposed to the step portion of the second multilayer substrate only in an area in which the plurality of first conductor patterns that are exposed to the step portion of the first multilayer substrate respectively face the plurality of second conductor patterns that are exposed to the step portion of the second multilayer substrate.

3. The multilayer substrate connecting body according to claim 1, wherein the plurality of second conductor patterns that are exposed to the step portion of the second multilayer substrate do not extend to an end portion of the step portion of the second multilayer substrate.

4. The multilayer substrate connecting body according to claim 1, wherein a thickness of the anisotropic conductive film is smaller than a total thickness of an insulating base material layer and a conductor pattern among the plurality of first and second insulating base material layers and the plurality of first and second conductor patterns that are in contact with the anisotropic conductive film.

5. The multilayer substrate connecting body according to claim 1, wherein a projecting length by which a conductor pattern among the plurality of first and second conductor patterns that is exposed to the step portion projects in a planar direction of a respective one of the plurality of first and second insulating base material layers is larger than a total thickness length of an insulating base material layer and a conductor pattern among the plurality of first and second insulating base material layers and the plurality of first and second conductor patterns that are in contact with the anisotropic conductive film.

6. The multilayer substrate connecting body according to claim 1, wherein a resist film is provided on a portion of each of the first conductor pattern and the second conductor pattern.

7. The multilayer substrate connecting body according to claim 1, wherein the anisotropic conductive film includes fine conductive particles dispersed in a thermosetting resin.

8. The multilayer substrate connecting body according to claim 1, wherein the plurality of first and second insulating base material layers are made of thermoplastic resin.

9. The multilayer substrate connecting body according to claim 8, wherein the thermoplastic resin is liquid crystal polymer.

10. The multilayer substrate connecting body according to claim 1, wherein a thickness of each of the plurality of first and second insulating base material layers is about 25 μm, and a thickness of the anisotropic conductive film is about 10 μm.

11. A transmission line device comprising:
the multilayer substrate connecting body according to claim 1; wherein
the plurality of first conductor patterns included in the first multilayer substrate include a first signal conductor pattern and a first ground conductor pattern that define a first transmission line;
the plurality of second conductor patterns included in the second multilayer substrate include a second signal conductor pattern and a second ground conductor pattern that define a second transmission line; and
at the step portion, the first signal conductor pattern and the second signal conductor pattern are electrically connected to each other and the first ground conductor pattern and the second ground conductor pattern are electrically connected to each other.

12. The transmission line device according to claim 11, wherein
the plurality of first conductor patterns that are exposed to the step portion of the first multilayer substrate, in the stacking direction, partially project from a surface of the step portion of the first multilayer substrate;
the plurality of second conductor patterns that are exposed to the step portion of the second multilayer substrate, in the stacking direction, partially project from a surface of the step portion of the second multilayer substrate; and
the plurality of first conductor patterns that are exposed to the step portion of the first multilayer substrate are electrically connected to the plurality of second conductor patterns that are exposed to the step portion of the second multilayer substrate only in an area in which the plurality of first conductor patterns that are exposed to the step portion of the first multilayer substrate respectively face the plurality of second conductor patterns that are exposed to the step portion of the second multilayer substrate.

13. The transmission line device according to claim 11, wherein the plurality of second conductor patterns that are exposed to the step portion of the second multilayer substrate do not extend to an end portion of the step portion of the second multilayer substrate.

14. The transmission line device according to claim 11, wherein a thickness of the anisotropic conductive film is smaller than a total thickness of an insulating base material layer and a conductor pattern among the plurality of first and second insulating base material layers and the plurality of first and second conductor patterns that are in contact with the anisotropic conductive film.

15. The transmission line device according to claim 11, wherein a projecting length by which a conductor pattern among the plurality of first and second conductor patterns that is exposed to the step portion projects in a planar direction of a respective one of the plurality of first and second insulating base material layers is larger than a total thickness length of an insulating base material layer and a conductor pattern among the plurality of first and second insulating base material layers and the plurality of first and second conductor patterns that are in contact with the anisotropic conductive film.

16. The transmission line device according to claim 11, further comprising a resist film provided on a surface of at least one of the plurality of first and second insulating base material layer layers.

17. The transmission line device according to claim 11, wherein the anisotropic conductive film includes fine conductive particles dispersed in a thermosetting resin.

18. The transmission line device according to claim 11, wherein the plurality of first and second insulating base material layers are made of thermoplastic resin.

19. The transmission line device according to claim 18, wherein the thermoplastic resin is liquid crystal polymer.

20. The transmission line device according to claim 11, wherein a thickness of each of the plurality of first and second insulating base material layers is about 25 μm, and a thickness of the anisotropic conductive film is about 10 μm.

* * * * *